US009881751B2

(12) United States Patent
Osawa

(10) Patent No.: US 9,881,751 B2
(45) Date of Patent: Jan. 30, 2018

(54) INPUT APPARATUS AND ELECTRONIC APPARATUS

(71) Applicant: CASIO COMPUTER CO., LTD., Shibuya-ku, Tokyo (JP)

(72) Inventor: Motome Osawa, Ome (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/391,736

(22) Filed: Dec. 27, 2016

(65) Prior Publication Data

US 2017/0213664 A1 Jul. 27, 2017

(30) Foreign Application Priority Data

Jan. 21, 2016 (JP) ................................. 2016-009454

(51) Int. Cl.
| | |
|---|---|
| *G06F 1/16* | (2006.01) |
| *H01H 13/70* | (2006.01) |
| *H01H 19/00* | (2006.01) |
| *G06F 3/02* | (2006.01) |
| *H01H 13/14* | (2006.01) |
| *H05K 5/00* | (2006.01) |
| *H05K 5/02* | (2006.01) |
| *H05K 5/03* | (2006.01) |

(52) U.S. Cl.
CPC ............ *H01H 13/14* (2013.01); *H01H 13/70* (2013.01); *H05K 5/0017* (2013.01); *H05K 5/0226* (2013.01); *H05K 5/03* (2013.01)

(58) Field of Classification Search
CPC ...... H01H 13/14; H01H 13/70; H05K 5/0017; H05K 5/0226; H05K 5/03

USPC ...... 361/679.13; 200/5 R, 6 A; 345/168, 169
See application file for complete search history.

(56) References Cited

U.S. PATENT DOCUMENTS

| | | | |
|---|---|---|---|
| 6,399,904 B1 * | 6/2002 | Mimata | G05G 9/047 200/406 |
| 7,285,741 B2 | 10/2007 | Kato | |
| 2003/0116414 A1 * | 6/2003 | Maeda | H01H 25/041 200/56 R |
| 2003/0206159 A1 * | 11/2003 | Ohgitani | G06F 3/0338 345/169 |

(Continued)

FOREIGN PATENT DOCUMENTS

| | | |
|---|---|---|
| JP | 58062525 U | 4/1983 |
| JP | 61167327 U | 10/1986 |

(Continued)

OTHER PUBLICATIONS

Japanese Office Action dated Oct. 24, 2017 issued in counterpart Japanese Application No. 2016-009454.

*Primary Examiner* — Sherman Ng
(74) *Attorney, Agent, or Firm* — Holtz, Holtz & Volek PC

(57) ABSTRACT

A key structure includes a key, a key sheet and a supporting portion. The key displaces in a direction. The key sheet is disposed at a side of the key toward which the key displaces and comprises a sheet base portion and a contacting portion that displaces in the displacing direction of the key in accordance with a displacement of the key. The supporting portion is disposed between the key and the sheet base portion and supports one end portion of the key by contacting a member disposed opposite to the supporting portion while the other end portion of the key displaces in the displacing direction of the key.

15 Claims, 4 Drawing Sheets

(56) References Cited

U.S. PATENT DOCUMENTS

| | | | | |
|---|---|---|---|---|
| 2003/0210234 A1* | 11/2003 | Seya | ............... | H01H 25/041 |
| | | | | 345/172 |
| 2006/0137966 A1 | 6/2006 | Kato | | |
| 2006/0284710 A1* | 12/2006 | Takatsuka | ............ | G06F 3/0202 |
| | | | | 335/205 |
| 2007/0074959 A1* | 4/2007 | Ikeda | ............... | H01H 25/041 |
| | | | | 200/5 R |
| 2009/0252976 A1* | 10/2009 | Hyuga | ............... | H01H 13/14 |
| | | | | 428/447 |

FOREIGN PATENT DOCUMENTS

| | | | |
|---|---|---|---|
| JP | 01012728 | Y2 | 4/1989 |
| JP | 09001678 | A | 1/1997 |
| JP | 2006185776 | A | 7/2006 |
| JP | 2007179376 | A | 7/2007 |
| JP | 2008159026 | A | 7/2008 |
| JP | 2008192535 | A | 8/2008 |
| JP | 2013058351 | A | 3/2013 |

\* cited by examiner

INPUT APPARATUS AND ELECTRONIC APPARATUS

CROSS REFERENCE TO RELATED APPLICATION

This application is based upon and claims the benefit of priority under 35 USC 119 of Japanese Patent Application No. 2016-009454 filed on Jan. 21, 2016, the entire disclosure of which, including the description, claims, drawings and abstract, is incorporated herein by reference in its entirety.

BACKGROUND OF THE INVENTION

1. Technical Field

The technical field relates to a key structure and an electronic apparatus with the key structure.

2. Description of Related Art

An electronic apparatus that includes an apparatus case composed of an upper case and a lower case and a key input section disposed in the apparatus case has been known in the art as disclosed in JP 2008-159026A, in which the key input section includes a key sheet that is disposed on the inner face of the upper case and that includes key button portions exposed on the upper face of the upper case, the key sheet has a number of pin holes excluding the areas corresponding to the key button portions, the upper case includes a number of fitting protrusions in the inner face that are inserted to fit in the respective number of pin holes of the key sheet.

A key sheet is typically made of elastic rubber, in which skirts are provided between contacting portions and a sheet base portion to keep the contacting portions constituting the key button portions apart from the sheet base portion of the key sheet, and a conductive membrane of carbon or the like is formed on the back face of the contacting portions.

The key button portions may be constituted by the contacting portions themselves on which signs (e.g. alphabets, etc.) of the key button portions are directly printed or by the contacting portions and resin keys attached thereon.

In an electronic apparatus using such a key sheet, a control circuit board of the electronic apparatus is disposed on the back side of the key sheet such that electrodes for detecting a user key operation are arranged corresponding to the key button portions.

When a user pushes down the front side of a key button portion, the skirt is buckled so that the key button portion comes in contact with an electrode of the control circuit board, and the electrode of the control circuit board thereby turns to be conductive. The electronic apparatus thus detects the user key operation.

Increasing the size of the key button portions improves the visibility of the key button portions. However, when the user pushed down a key button portion so that a skirt is buckled, the skirt is less likely to be uniformly folded, which may cause an unintended double click.

SUMMARY OF THE INVENTION

In order to realize the above object, according to a first aspect of the present invention, there is provided a key structure, including:
a key that displaces in a direction;
a key sheet that is disposed at a side of the key toward which the key displaces and that comprises a sheet base portion and a contacting portion that displaces in the displacing direction of the key in accordance with a displacement of the key; and
a supporting portion that is disposed between the key and the sheet base portion and that supports one end portion of the key by contacting a member disposed opposite to the supporting portion while the other end portion of the key displaces in the displacing direction of the key.

According to a second aspect of the present invention, there is provided a key structure, including:
a circuit board;
a key that displaces in a direction towards the circuit board; and
a key sheet that is intervened between the circuit board and the key;
wherein the key sheet comprises a sheet base portion that is disposed opposite to a first end portion of the key, a contacting portion that is disposed opposite to a second end portion of the key and that displaces in the displacing direction of the key in accordance with a displacement of the key, the first end portion of the key opposing to the second end portion thereof, and a skirt portion that connects the sheet base portion with the contacting portion and that deforms in accordance with the displacement of the key; and
wherein the key structure further comprises supporting portion that is disposed between the key and the sheet base portion of the key sheet and that supports the first end portion of the key by contacting a member disposed opposite to the supporting portion while the second end portion of the key displaces in the displacing direction of the key.

According to a third aspect of the present invention, there is provided an electronic apparatus, including:
a circuit board; and
a key structure disposed along the circuit board;
wherein the key structure includes:
a key that displaces in a direction;
a key sheet that is disposed at a side of the key toward which the key displaces and that comprises a sheet base portion and a contacting portion that displaces in the displacing direction of the key in accordance with a displacement of the key; and
a supporting portion that is disposed between the key and the sheet base portion and that supports one end portion of the key by contacting a member disposed opposite to the supporting portion while the other end portion of the key displaces in the displacing direction of the key, and
wherein the circuit board includes an electrode that comes in contact with an opposite side of the contacting portion to the side with the key in accordance with the displacement of the key.

BRIEF DESCRIPTION OF THE DRAWINGS

The present invention will become more fully understood from the detailed description given hereinbelow and the appended drawings which are given by way of illustration only, and thus are not intended as a definition of the limits of the present invention, and wherein:

FIG. 3A and FIG. 3B are exploded plan views of the components in FIG. 2, in which FIG. 3A is a plan view of the key structure illustrating the back side thereof, and FIG. 3B is a plan view of the cover illustrating the back side thereof;

FIG. 6A and FIG. 6B are cross sectional views corresponding to FIG. 4, which also depicts a circuit board of the electronic dictionary of the embodiment, in which FIG. 6A illustrates the state when a user is not pressing the front face of the resin key, and FIG. 6B illustrates the state when the user is pressing the surface of the resin key.

Figure 1:
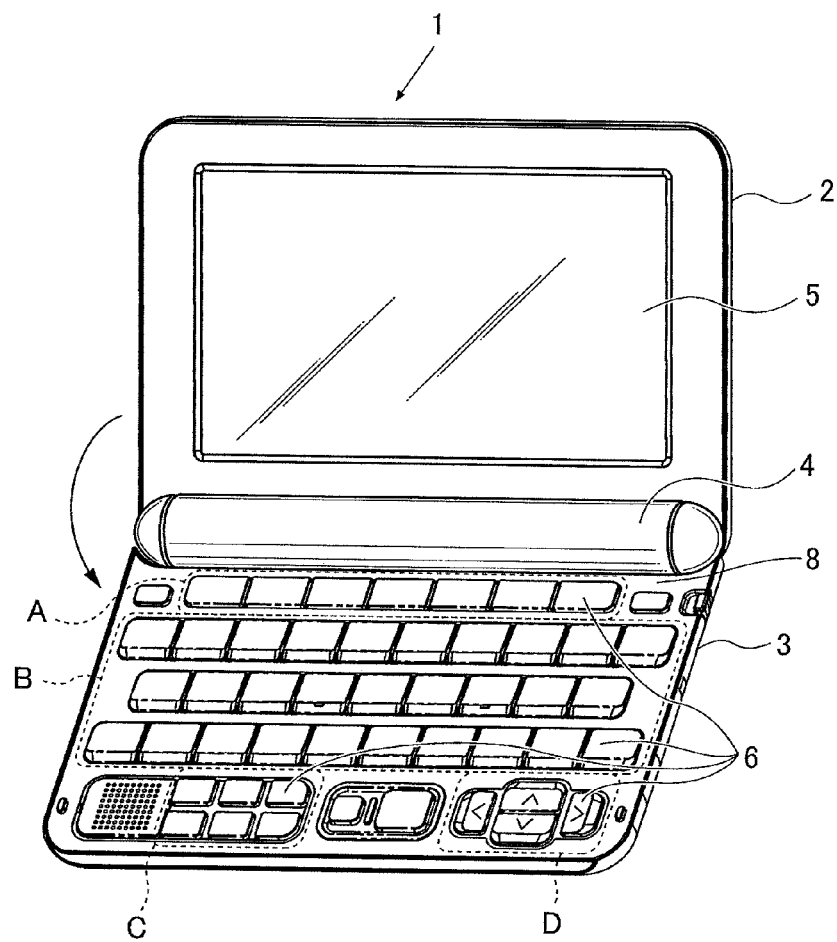
FIG. 1 is a perspective view of an electronic dictionary according to an embodiment of the present invention.

The components in the drawings are not necessarily to scale relative to each other.

DETAILED DESCRIPTION OF THE PREFERRED EMBODIMENT

Hereinafter, a mode for carrying out the present invention (hereinafter referred to as an embodiment) will be described in detail referring to the appended drawings.

The same reference numbers or signs are denoted to the same components throughout the description and drawings.

FIG. 1 is a perspective view of an electronic dictionary 1 that includes a key structure 10 of the present invention.

In the following description, the key structure 10 (see FIG. 3A) of the present invention will be described with the electronic dictionary 1 as an example. However, the key structure 10 of the present invention is applicable not only to electronic dictionaries but also to general electronic apparatuses such as calculators.

As illustrated in FIG. 1, the electronic dictionary 1 includes a first case (first housing) 2, a second case (second housing) 3 having approximately the same outer shape as the first case 2, and a hinge portion 4 that couples one end of the first case 2 to the other end of the second case 3. The first case 2 and the second case 3 are pivotably coupled to each other at the pivot axis of the hinge portion 4.

In the first case 2, a display 5 is disposed which is constituted by a flat display panel such as a liquid crystal display panel or an EL (electroluminescent) display panel.

In the second case 3, key buttons 6 are disposed such that they protrude on the side of the second case 3 that is opposed to the display 5 when the first case 2 is pivoted and folded onto the second case 3 as illustrated by the arrow in FIG. 1.

For example, the key buttons 6 enclosed by the dashed line frame A, which are laterally aligned in a line, are related to a main menu for selecting a dictionary from stored dictionaries and making basic setting.

The key buttons 6 enclosed by the dashed line frame B, which are arranged in three lateral lines parallel to each other in the front-back direction, are character entry keys that are used for entering characters such as alphabets, hiraganas and katakanas to the electronic dictionary 1.

The six key buttons 6 enclosed by the dashed line frame C are related to a sub menu, and the key buttons 6 enclosed by the dashed line frame D are used for moving a cursor displayed on the display 5 and the like.

In the embodiment, the character entry keys 6 enclosed by the dashed line frame B have a larger size than normal, and signs (not shown) such as alphabets on the surfaces of the key buttons 6 are also printed in a larger size.

In this way, the size of the frequently-used key buttons 6 is increased so that the signs printed on the surfaces of the key buttons 6 are more visible. This can improve the user operability of the apparatus.

The key buttons 6 that are increased in size are not limited to the character entry key buttons 6 and may also be the key buttons 6 related to the main menu that are enclosed by the dashed line frame A.

However, when the size of the key buttons 6 is simply increased while the other configuration remains the same as before, a double click is more likely to occur. To prevent the occurrence of a double click, the key buttons 6 with an increased size are configured as follows.

Key Structure

The electronic dictionary 1 as illustrated in FIG. 1 is configured such that a control circuit board (not shown, hereinafter also referred to simply as a circuit board) is disposed in the second case 3, the key structure 10 (see FIG. 3A) described in detail below is provided thereon, and a cover 8 is further provided on the key structure 10.

In the following description, the side of each component on which a user performs an operation is referred to as the front side, and the other side from the front side is referred to as the back side.

Figure 2:
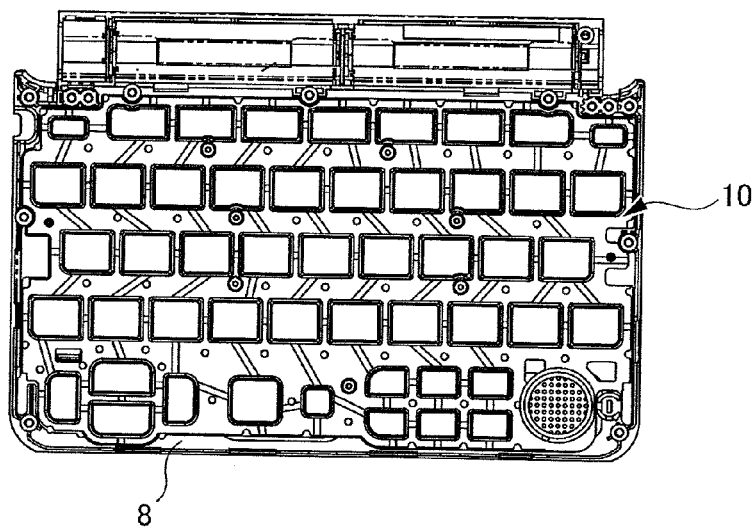
FIG. 2 is a plan view of a cover and a key structure according to the embodiment of the present invention, illustrating the back sides thereof.

FIG. 2 is a plan view of the cover 8 and the key structure 10 disassembled from the electronic dictionary 1, illustrating the back sides thereof that are designed to be opposed to the circuit board (not shown) disposed in the second case 3.

Figure 3A:
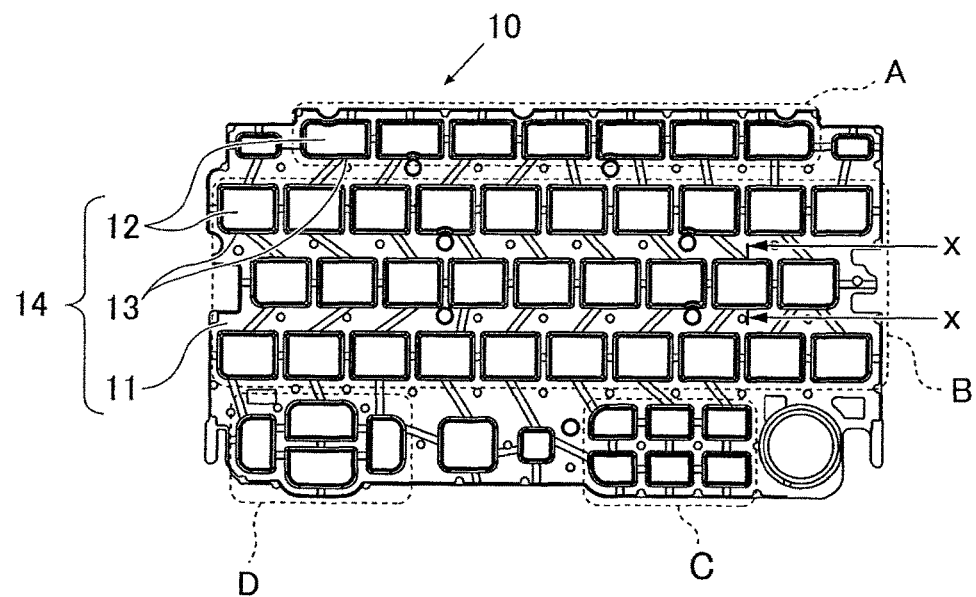
Figure 3B:
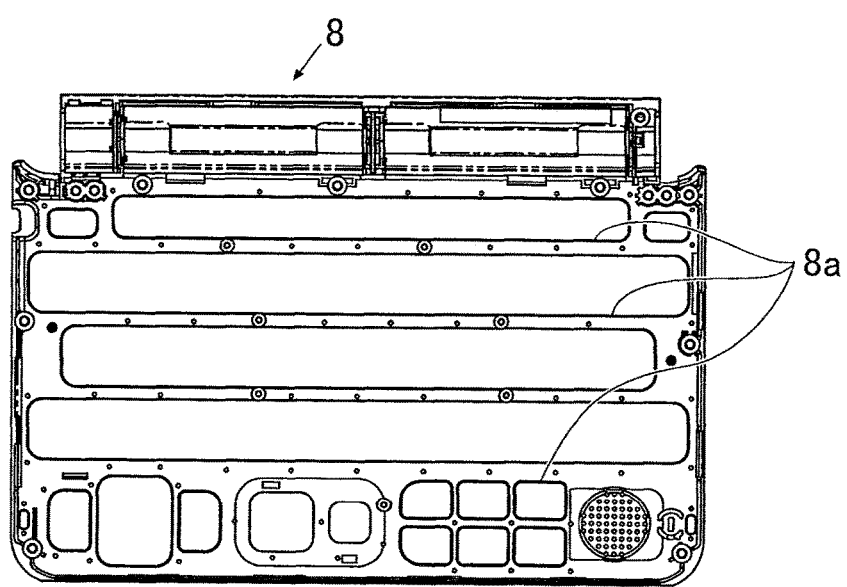

FIG. 3A and FIG. 3B are exploded plan views of the components of FIG. 2, in which FIG. 3A is a plan view of the key structure 10 illustrating the back side thereof, and the FIG. 3B is a plan view of the cover 8 illustrating the back side thereof.

The dashed line frames A, B, C and D in FIG. 3A correspond respectively to the areas enclosed by the dashed line frames A, B, C and D in FIG. 1.

Figure 4:
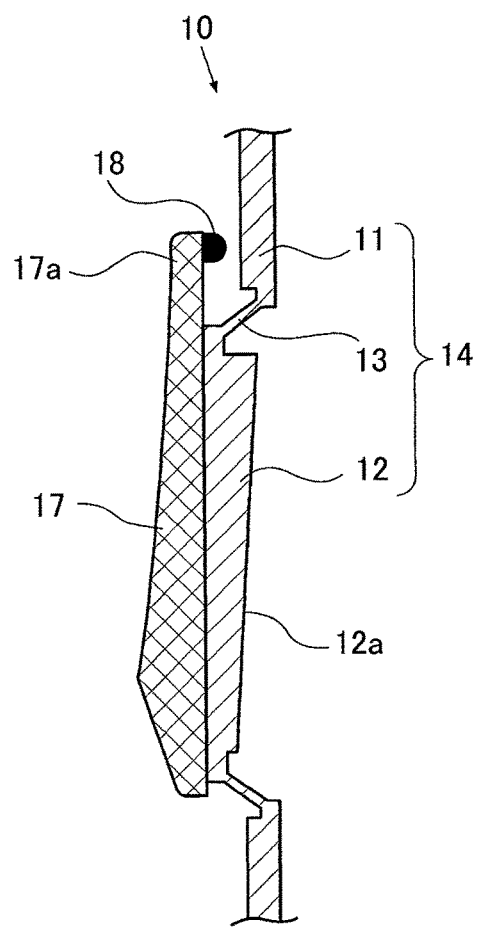
FIG. 4 is a cross sectional view of the key structure of FIG. 3A taken along the line X-X.

FIG. 4 is a cross sectional view of one of the character entry key buttons 6 enclosed by the dashed line frame B, taken along the line X-X in FIG. 3A.

That is, FIG. 4 is a cross sectional view of a key button 6 with an increased size that is larger than normal.

As illustrated in FIG. 3A and FIG. 4, the key structure 10 of the embodiment includes resin keys (keys) (see FIG. 4) disposed on the side pressed by the user, and a key sheet 14 on which the resin keys 17 are disposed.

The key sheet 14 is constituted by an integrally formed sheet of rubber, elastomer or the like (so-called rubber sheet). The key sheet 14 includes a sheet base portion 11, contacting portions 12 on which resin keys 17 are disposed, and skirts 13 that are intervened between the sheet base portion 11 and the respective contacting portions 12 to elastically support the contacting portions 12 such that the contacting portions 12 protrude from the sheet base portion 11 toward the resin keys 17.

The key buttons 6 in FIG. 1 are configured such that the resin keys 17 that are disposed on the contacting portions 12 serve as the portions protruded and exposed through openings of the cover 8 (described below) to the side on which the user performs an operation.

The back faces of the contacting portions 12, which are the other side from the front side opposed to the resin keys 17, are opposed to the circuit board (not shown) of the electronic dictionary 1, and a thin film of electrically conductive material such as carbon is provided on the back faces of the contacting portions 12 opposed to the circuit board.

When the user presses (pushes down) a key button 6 illustrated in FIG. 1, i.e. presses (pushes down) a resin key 17 of the key structure 10, the back face of the contacting portion 12 comes in contact with an electrode that is formed on the front face of the circuit board disposed on the back side of the sheet base portion 11. Then, the electrode of the circuit board turns to be electrically conductive.

As illustrated in FIG. 4, the resin keys 17 include an extended part 17a that extends to the sheet base portion 11, and the extended part 17a includes a supporting portion 18 that is a protrusion protruding toward the sheet base portion 11 and having a rounded tip. The supporting portion 18 is made of material such as resin that has higher rigidity than the material of the key sheet 14.

The extended part 17a of each resin key 17 extends from the side opposed to the display 5 (see FIG. 1). The reason will be described later in detail.

Figure 5:
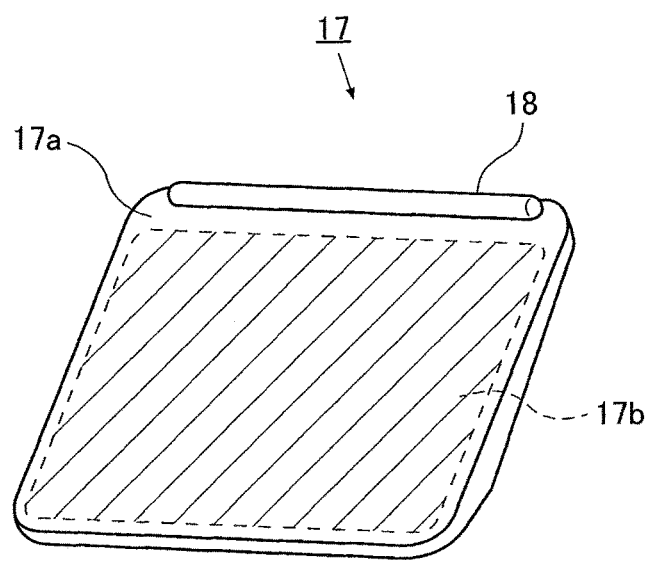
FIG. 5 is a perspective view of a resin key according to the embodiment of the present invention, illustrating the back side thereof.

FIG. 5 is a perspective view of a resin key 17, illustrating the back side thereof opposed to a contacting portion 12.

The area 17b indicated by hatching in FIG. 5 is pasted to a contacting portion 12 of the key sheet 14 by means of adhesive or the like. In the embodiment, the supporting portion 18, which is disposed in the extended part 17a extending from the side of the pasted part 17b toward the display 5, is constituted by a ridge that is formed on the rectangular back face of the resin key 17 along the side opposed to the display 5.

As illustrated in FIG. 4, the contacting portion 12 that corresponds to the resin key 17 with the extended part 17a has a back face 12a that is opposed to the circuit board (not shown) with an inclination angle of about 3 degrees such that the distance to the circuit board (not shown) increases from the side with the supporting portion 18 to the opposite side (lower side in the figure) of the resin key 17. In other words, the contacting portion 12 of the key sheet 14 is formed such that the distance from the opposite side to the side with the resin key 17 to the circuit board 20 decreases toward the supporting portion 18. As can be seen from FIG. 4, the contacting portion 12 of the key sheet 14 is formed such that the thickness increases toward the supporting portion 18.

In the embodiment, such resin keys 17 having the extended part 17a with the supporting portion 18 are used only for the key buttons 6 enclosed by the dashed line frame B in FIG. 1 and FIG. 3A, and only the corresponding contacting portions 12 have the inclined back face. For the other key buttons 6, resin keys 17 that do not have the extended part 17a with the supporting portion 18 are used, and the corresponding contacting portions 12 have the flat back face with no inclination.

However, in addition to the key buttons 6 enclosed by the dashed line frame B in FIG. 1 and FIG. 3A, resin keys 17 having the extended part 17a with the supporting portion 18 may also used for the other key buttons 6 according to need, and the corresponding contacting portions 12 may have the inclined back face.

Cover

The cover 8 is disposed on or over the key structure 10 to cover the front side of the key structure 10 and is fixed on the second case 3 as illustrated in FIG. 1. As illustrated in FIG. 3B, the cover 8 has openings 8a so that the resin keys 17 of the key structure 10 are exposed on the front side of the cover 8. Each of the openings 8a is formed in an elongated shape so that the surfaces of a plurality of resin keys 17 aligned in a certain direction (the right-left direction in FIG. 3B) are exposed to the outside. Each of the openings 8a has a length in the certain direction approximately equal to the length of the plurality of resin keys 17 aligned in the certain direction and a length in the direction perpendicular to the certain direction approximately equal to the length in the width direction of the plurality of resin keys 17.

The openings 8a may be individually formed corresponding to the respective resin keys 17. Alternatively, the openings 8a may be slotted holes each of which corresponds to the aligned length of laterally aligned resin keys 17 (e.g. resin keys 17 of the main menu key buttons 6 or the character entry key buttons 6 enclosed by the dashed line frames A, B in FIG. 1) so that the laterally aligned resin keys 17 are exposed on the front side of the cover 8. Such openings 8a each corresponding to a plurality of resin keys 17 can reduce the production cost and the like.

Next, the above-described key structure 10 will be described in more detail including the operation thereof and the like.

Figure 6A:
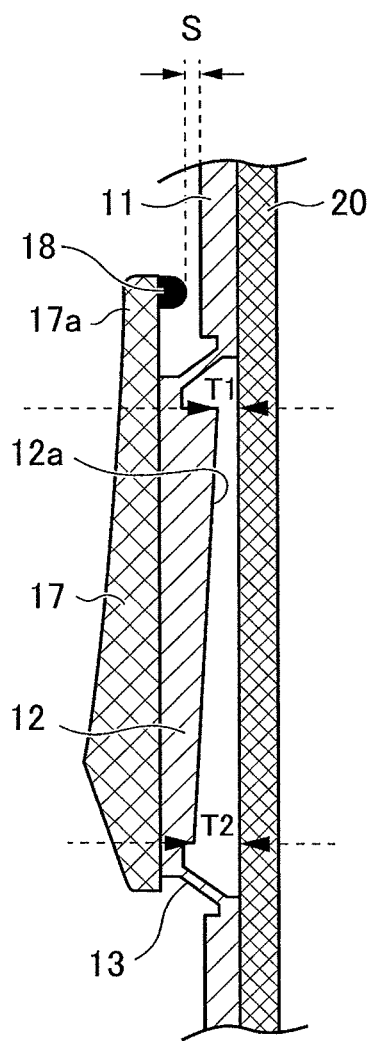
Figure 6B:
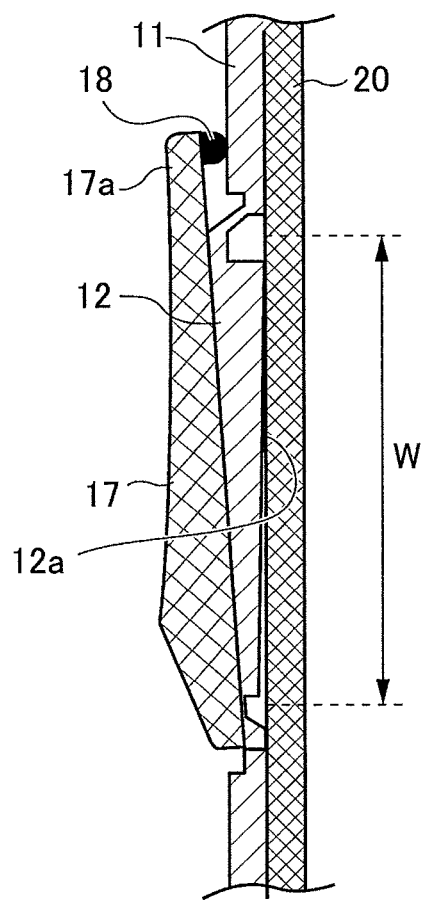

FIG. 6A and FIG. 6B are cross sectional views corresponding to FIG. 4 that also depicts the circuit board 20 of the electronic dictionary 1.

FIG. 6A illustrates the state when the user is not pressing (pushing down) a key button 6 (i.e. the user is not pressing the front face of a resin key 17), and FIG. 6B illustrates the state when the user is pressing (pushing down) the key button 6 (i.e. the user is pressing the front face of the resin key 17).

As illustrated in FIG. 6A, the supporting portion 18 of the resin key 17 is spaced at a distance S from the sheet base portion 11 when the resin key 17 is not pressed.

However, in terms of reducing the occurrence of a double click, it is not required that the supporting portion 18 is spaced from the sheet base portion 11.

However, spacing the supporting portion 18 from the sheet base portion 11 as in the embodiment can reduce the load on a finger of the user that is generated when the user presses the resin key 17 to press (push down) the key button 6. This can prevent the user from feeling an excessive weight when pressing (pushing down) the key button 6. Therefore, it is preferred that the supporting portion 18 of the resin key 17 is spaced from the sheet base portion 11 when the resin key 17 is not pressed.

To be more specific, it is preferred that the distance S is greater than one fifth of the stroke Y, i.e. S≥Y/5 mm, where the stroke Y means the moving distance of the contacting portion 12 when the user presses the resin key 17 until the contacting portion 12 comes in contact with the circuit board 20 and stops, since a too short distance S cannot produce the effect of spacing.

As described above, the contacting portion 12 has the inclined back face 12a. To be more specific, the distance from the front face of the circuit board 20 disposed on the back side of the sheet base portion 11 to the edge of the back face 12a at the side with the supporting portion 18 is referred to as the distance T1, and the distance from the front face of the circuit board 20 to the edge at the opposite side is referred to as the distance T2. It is preferred that the distance T1 is approximately the same as the above-described distance S.

When the supporting portion 18 is spaced from the sheet base portion 11 as in the embodiment, it is preferred that the distance T1 is approximately the same as the distance of the space of the supporting portion 18.

When the distance of the space of the supporting portion 18 is approximately the same, the electrode (not shown) of the circuit board 20 turns to be conductive almost at the same time when the supporting portion 18 comes in contact with the sheet base portion 11. Accordingly, the electronic dictionary 1 makes a response almost at the same time when the user feels the key button 6 hit the bottom in his finger, which can give the user comfortable operational feeling.

Since the stroke of the contacting portion 12 is determined by the abutment of the back face of the contacting portion 12 with the front face of the circuit board 20, the distance T2 is set to approximately Y mm so that the stroke of the contacting portion 12 becomes Y mm. The stroke Y mm is equal to the maximum displacement in the displacing direction (stroke direction) of the key buttons 6 and the resin keys 17.

When the user presses (pushes down) the key button 6, i.e. presses (pushes down) the front face of the resin key 17, the skirt 13 is firstly distorted in response to the pressure (pushing down), and the supporting portion 18 of the resin key 17 then comes in contact with the sheet base portion 11 before the skirt 13 is buckled.

By the abutment, a linear fulcrum is formed between the supporting portion 18 and the sheet base portion 11.

Since the supporting portion 18 has a rounded tip as described above, the side of the resin key 17 opposite the side with the supporting portion 18 swings about the fulcrum. In other words, when the other end portion (distal end portion relative to the hinge portion 4, lower side in FIG. 4) of the resin key 17 is displaced in the displacing direction of the resin key 17, the supporting portion 18, which is disposed between the resin key 17 and the key sheet 14, comes in contact with a member disposed opposite the supporting portion 18 and thereby supports the extended part 17a, which is one end portion (proximal end portion relative to the hinge portion 4, upper side in FIG. 4) of the resin key 17. Since the supporting portion 18 is made of material that has higher rigidity than the material of the key sheet 14 as described above, it is possible to stably support the extended part 17 of the resin key 17 by means of the supporting portion 18 when the resin key 17 displaces in the displacing direction.

In particular, the contacting portion 12 that corresponds to the resin key 17 with the extended part 17a has the back face 12a that is opposed to the circuit board with an inclination such that the distance to the circuit board 20 increases from the side with the supporting portion 18 to the opposite side of the resin key 17.

The inclination accords with the direction of the swing about the above-described fulcrum of the resin key 17. This makes it certain that the resin key 17 moves such that the side opposite the supporting portion 18 of the resin key 17 swings. Since the skirt 13 is always buckled in a manner along with this movement, an irregular buckling such as those observed when such a fulcrum is not formed does not occur, and the occurrence of a double click due to the irregularity of bucking is thus prevented.

Further, since the user is typically in the position opposed to the display 5, it is easier for him/her to move his/her finger in the direction away from the hinge portion 4, i.e. toward the front side, in order to operate the resin keys 17.

The supporting portion 18 is provided at the side opposed to the display 5 so that a fulcrum is formed at the side opposed to the display 5 of the resin key 17. In combination with such typical finger movement of the user, this makes it more certain that the resin key 17 moves such that the side opposite the supporting portion 18 of the resin key 17 swings. This eliminates an irregular buckling of the skirt 13 and thus prevents the occurrence of a double click due to the irregularity of buckling.

Furthermore, the inclination allows the side opposite the supporting portion 18 of the resin key 17 to displace a longer distance, and the degree of deformation of the skirt 13 is different between the side with the supporting portion 18 and the side opposite the supporting portion 18 accordingly. This enhances snap (click) feeling when the user operates the key button 6 (presses the resin key 17) and can thus improve the user operational feeling.

In terms of reducing the occurrence of a double click, it is only required that a linear fulcrum is formed that serves as a pivot of the swing of the resin key 17. As described above, the supporting portion 18 may be originally in contact with the sheet base portion 11 when the user is not pressing (pushing down) the key button 6.

However, such a supporting portion 18 that is originally in contact with the sheet base portion 11 deprives the cushioning against a user press, which increases the load on a finger and deteriorates the operational feeling. Accordingly, it is preferred that the supporting portion 18 is spaced from the sheet member as in the embodiment when the key button 6 is not pressed.

In contrast, when the supporting portion 18 is spaced at a great distance from the sheet 11, the skirt 13 is buckled before the supporting portion 18 forms a fulcrum. Since an irregular buckling may occur in this case, it is preferred that the distance S between the tip of the supporting portion 18 and the sheet base portion 11 as illustrated in FIG. 6A is equal to or less than a half of the stroke Y (mm) of the contacting portion 12, i.e. $S \leq Y/2$ mm. Accordingly, it is preferred that the tip of the supporting portion 18 is located at a distance of Y/2 mm or less from the sheet base portion 11. In conclusion, it is preferred that the distance S between the supporting portion 18 and the sheet base portion 11 falls within the range of ⅕ to ½ of the maximum displacement of the resin key 17.

In the embodiment, the distance S is set to $S \approx Y/3$ mm so that the supporting portion 18 is spaced at a distance of approximately one third of the stroke of the contacting portion 12 from the sheet base portion 11.

The range W illustrated by the two-way arrow in FIG. 6B indicates the area of an electrode formed on the circuit board 20, which is larger than the area of the contacting portion 12 as illustrated in FIG. 6B.

That is, in the embodiment, the area of the electrode 20 formed on the circuit board 20 is larger than the area of the back face of the corresponding contacting portion 12 so that the electrode surely turns to be conductive as soon as the back face of the contacting portion 12 comes in contact with the electrode. This prevents the user from feeling a sense of delay and can thus give the user comfortable operational feeling.

While the present invention is described with the specific embodiment, it should be understood that the technical scope of the present invention is not limited to the embodiment.

For example, in the embodiment, the supporting portion 18 that is disposed in the extended part 17a of the resin key 17 is a single linear protrusion as illustrated in FIG. 5.

However, since the protrusion 18 is intended to form a linear fulcrum between the supporting portion 18 and the sheet base portion 11, it may be composed of a plurality of protrusions aligned in a straight line.

In the case of a plurality of protrusions aligned in a line, the respective contact points of the protrusions with the sheet base portion 11 align in a straight line to form a linear fulcrum.

When such a plurality of protrusions aligned in a line is provided, it is not required to provide many protrusions. With a proper position (distance between spaced protrusions, etc.), even two or three protrusions can form a linear fulcrum.

The supporting portion 18 may be disposed on the key sheet between the sheet base portion 11 of the key sheet 14 and the extended part 17a of the resin key 17.

Further, it is not required that the supporting portion 18 is in contact with the extended part 17a of the resin key 17 or the sheet base portion 11 of the key sheet 14 when it supports the extended part 17a of the resin key 17. Specifically, a flat plate member may intervene between the sheet base portion 11 of the key sheet 14 and the supporting portion 18 so that the supporting portion comes in contact with the flat plate member in accordance with a displacement of the resin key 17. In this case, when the flat plate member is made of material that has higher hardness than the material of the sheet base portion 11 of the key sheet 14, the extended part 17a of the resin key 17 is supported more stably by means of the supporting portion 18, In the present invention, a variety of changes and modifications can be made in the above-described specific embodiment, and such changed or modified embodiments are also to be included in the technical scope of the present invention, which is obvious for a skilled person from the recitation of the claims.

While various embodiments have been described herein above, it is to be appreciated that various changes in form and detail may be made without departing from the spirit and scope of the invention(s) presently or hereafter claimed. Further, each embodiment includes different stages of the invention, and suitable combinations of the disclosed components can be extracted as different aspects of the invention. For example, even when some of the components of each embodiment are deleted or combined into a different configuration, such configurations can be extracted as the invention as long as they can solve the problem described as the solution to a problem and have at least one of the effects described as the advantageous effects of the invention.

What is claimed is:

1. A key structure, comprising:
    a key that displaces in a direction;
    a key sheet that is disposed at a side of the key toward which the key displaces and that comprises a sheet base portion and a contacting portion that displaces in the displacing direction of the key in accordance with a displacement of the key; and
    a supporting portion that is disposed between the key and the sheet base portion and that supports one end portion of the key by contacting a member disposed opposite to the supporting portion while the other end portion of the key displaces in the displacing direction of the key.

2. The key structure according to claim 1,
    wherein the key structure is designed to be disposed along a circuit board of an electronic apparatus
    wherein the contacting portion of the key sheet is formed such that a distance from the circuit board to an opposite side of the key to the side with the key decreases toward the supporting portion.

3. The key structure according to claim 1,
    wherein the contacting portion of the key sheet is formed such that a thickness thereof increases toward the supporting portion.

4. The key structure according to claim 1,
    wherein the key structure is designed to be disposed along a circuit board of an electronic apparatus
    wherein the contacting portion is configured such that when the key is not displaced, a distance from an end portion of the contacting portion proximal to the supporting portion to the circuit board is equal to or less than approximately a half of a distance from an end portion of the contacting portion distal to the supporting portion to the circuit board.

5. The key structure according to claim 1,
    wherein the key structure is designed to be disposed along a circuit board of an electronic apparatus
    wherein the supporting portion is configured such that when the key is not displaced, a distance from the supporting portion to the member disposed opposite to the supporting portion is approximately equal to a distance from the contacting portion to the circuit board.

6. The key structure according to claim 1,
    wherein when the key is not displaced, a distance from the supporting portion to the member disposed opposite the supporting portion falls within the range from ⅕ to ½ of a maximum displacement of the key.

7. The key structure according to claim 1,
    wherein the supporting portion is formed in a straight shape along a side of the rectangular key.

8. The key structure according to claim 1,
    wherein when the key is not displaced, the supporting portion is spaced from the member disposed opposite the supporting portion.

9. The key structure according to claim 1,
    wherein when the key is not displaced, the supporting portion is in contact with the member disposed opposite the supporting portion.

10. The key structure according to claim 1,
    wherein the supporting portion is made of material that has higher rigidity than a material of the key sheet.

11. A key structure, comprising: a circuit board; a key that displaces in a direction towards the circuit board; and a key sheet that is intervened between the circuit board and the key; wherein the key sheet comprises a sheet base portion that is disposed opposite to a first end portion of the key, a contacting portion that is disposed opposite to a second end portion of the key and that displaces in the displacing direction of the key in accordance with a displacement of the key, the first end portion of the key opposing to the second end portion thereof, and a skirt portion that connects the sheet base portion with the contacting portion and that deforms in accordance with the displacement of the key; and wherein the key structure further comprises a supporting portion that is disposed between the key and the sheet base portion of the key sheet and that supports the first end portion of the key by contacting a member disposed opposite to the supporting portion while the second end portion of the key displaces in the displacing direction of the key.

12. An electronic apparatus, comprising:
    a circuit board; and
    a key structure disposed along the circuit board;
    wherein the key structure comprises:
        a key that displaces in a direction;
        a key sheet that is disposed at a side of the key toward which the key displaces and that comprises a sheet base portion and a contacting portion that displaces in the displacing direction of the key in accordance with a displacement of the key; and
        a supporting portion that is disposed between the key and the sheet base portion and that supports one end portion of the key by contacting a member disposed opposite to the supporting portion while the other end portion of the key displaces in the displacing direction of the key, and wherein the circuit board comprises an electrode that comes in contact with an opposite side of the contacting portion to the side with the key in accordance with the displacement of the key.

13. The electronic apparatus according to claim 12; further comprising:
   a first housing that comprises a display portion that displays a screen corresponding to an input on the key;
   a second housing that comprises the circuit board and the key structure; and
   a hinge portion that couples the first housing and the second housing to each other,
   wherein the contacting portion is disposed in an end portion of the key proximal to the hinge portion.

14. The electronic apparatus according to claim 12, wherein the key comprises a plurality of keys aligned in a direction, and
   wherein the electronic apparatus further comprises:
      a cover that is disposed on or over the key structure and that has at least one opening having an elongated shape through which surfaces of the plurality of keys are exposed to an outside.

15. The electronic apparatus according to claim 12, wherein an area of the electrode formed on the circuit board is larger than an area of a back face of the corresponding contacting portion.

\* \* \* \* \*